United States Patent [19]
Westra

[11] 4,352,058
[45] Sep. 28, 1982

[54] METHOD AND APPARATUS FOR MEASURING LEAKAGE TO GROUND
[75] Inventor: Marlin D. Westra, Sioux Falls, S. Dak.
[73] Assignee: Sencore, Inc., Sioux Falls, S. Dak.
[21] Appl. No.: 117,611
[22] Filed: Feb. 1, 1980
[51] Int. Cl.³ .......................................... G01R 31/02
[52] U.S. Cl. .................................................. 324/51
[58] Field of Search ................. 324/51, 6.6; 340/650, 340/651; 362/50

[56] References Cited
U.S. PATENT DOCUMENTS
3,141,128  7/1964  Behr ...................................... 324/51
3,483,470 12/1969  Tsergas ................................. 324/51
3,878,458  4/1975  Muska .................................... 324/51

FOREIGN PATENT DOCUMENTS
998109 11/1976 Canada .................................. 324/51

Primary Examiner—Gerard R. Strecker
Assistant Examiner—Walter E. Snow
Attorney, Agent, or Firm—Edmond T. Patnaude

[57] ABSTRACT

Leakage current to ground from accessible locations on single phase electrical equipment is measured by powering the equipment through an isolation transformer and measuring the current flowing between the two power input terminals of the equipment under test via accessible locations on the equipment.

5 Claims, 2 Drawing Figures

METHOD AND APPARATUS FOR MEASURING LEAKAGE TO GROUND

The present invention relates in general to the art of measuring leakage current to ground, and it relates in particular to a new and improved method and apparatus for facilitating the measurement of leakage currents from electric appliances and other types of electrical equipment.

BACKGROUND OF THE INVENTION

Household appliances and the like usually have a flexible cord with a terminal plug at the end for connection to a single phase electric outlet. Ordinarily, the cord includes two power conductors and in some cases an additional grounding conductor. In order to prevent injury to persons coming in contact with the appliance it is important that accessible places be electrically isolated from the power busses of the appliance. There are standard tests for measuring the leakage current to ground from electric appliances, and safe leakage current standards have been established and appear in the *IEEEE Standard Dictionary of Electrical and Electronics Terms*.

In the past, these leakage tests have been performed by connecting the power terminals of the equipment under test to an electric power source through a reversing, double pole, double-throw switch. With the switch in one position an ammeter was connected between earth ground and various accessible locations on the appliance while the appliance was itself insulated from earth ground. The switch was then actuated to the other position and the test was repeated. The leakage test has also been carried out without use of the reversing switch, but by reversing the position of the appliance plug in the electrical outlet. This latter procedure can not be used of course, where the plug includes a grounding pin. When using either of these prior art testing procedures, the person performing the test is subjected to the possibility of electric shock if the appliance under test is dangerously defective.

SUMMARY OF THE INVENTION

Briefly, in accordance with one aspect of the present invention there is provided a novel leakage measuring instrument which includes an isolation transformer connected between the electric outlet and the power terminals of the appliance. An ammeter circuit is connected between a probe and a single throw-double pole switch which is used to selectively connect the ammeter and the probe to one or the other of the power terminals of the appliance under test.

When making this leakage test, each accessible part of the appliance is simply touched with the probe while observing the ammeter. The switch is then thrown to the other position and the probe is again touched to the accessible parts of the set. If the ammeter does not show an excessive leakage current throughout the test, the appliance is safe.

GENERAL DESCRIPTION OF THE DRAWINGS

The present invention will be better understood by a reading of the following detailed description taken in connection with the accompanying drawing wherein:

FIG. 1 is a front view of an electronic instrument embodying the present invention; and FIG. 2 is a schematic circuit diagram of a leakage current measuring circuit incorporated in the instrument of FIG. 1.

DETAILED DESCRIPTION OF THE INVENTION

Figure 1:
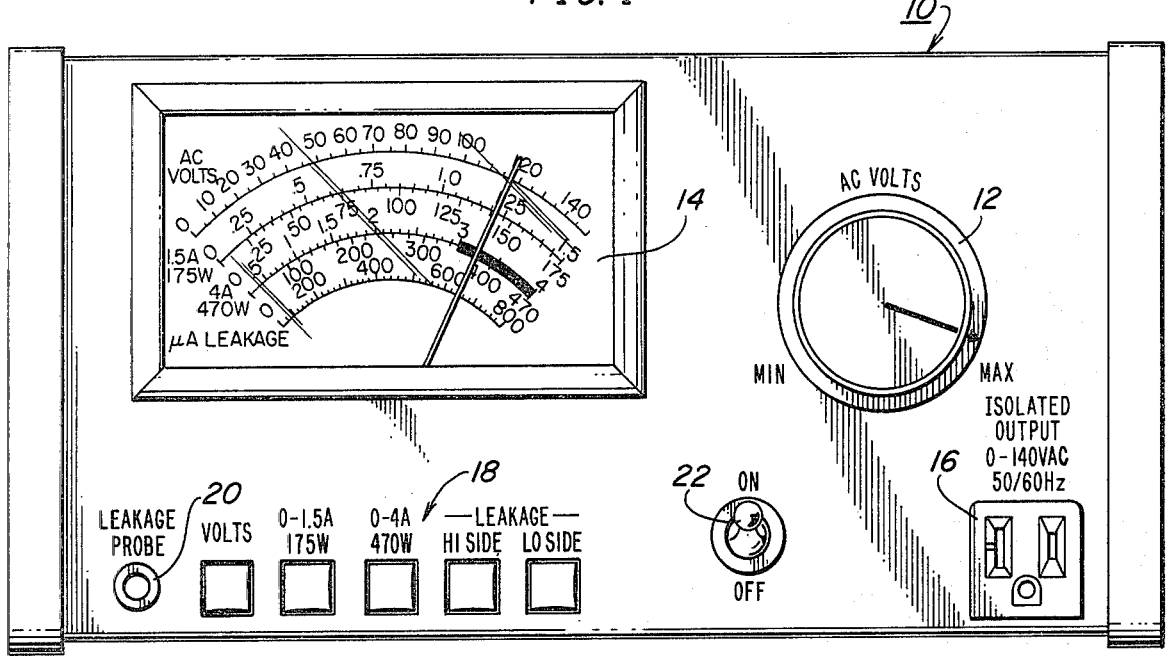

Referring to FIG. 1 of the drawing, there is shown an instrument 10 having the capability for use as an isolation transformer and as a safety analyzer for measuring the leakage current to earth ground of an electric appliance, television receiver or the like under test. The instrument includes a rotary control knob 12, a multiscale meter readout 14, a power output socket receptacle 16, a plurality of control push-buttons 18, a leakage probe receptacle 20 and an on-off switch 22.

When used as an isolated source of electric current, one or the other of the push-buttons labeled 0–1.5A or 0–4A are pushed in, and the meter 14 indicates on the appropriate scale the current flowing through a circuit connected between the two power terminals of the output socket 16.

When used as an isolated souce of voltage, the push-button labeled VOLTS is pushed in and the meter indicates the voltage across the power terminals of the output socket 16.

When used as a safety analyzer for measuring leakage current, the device under test is connected to the socket 16, and with the VOLTS push-button pushed in, the knob 12 is adjusted to set the output voltage at the rated voltage for the device under test.

With a probe (not shown in FIG. 1) in place in the receptacle 20, one or the other of the leakage push buttons is pushed in and the probe is touched to the various accessible conductive parts of the device under test while observing the position of the meter needle relative to the bottom (leakage current) scale. The other leakage push-button is then pushed in and the probe is again touched to each accessible conductive part of the device under test. Unless the meter shows an unacceptably high leakage current during the test, the device meets the standard leakage current requirements and is presumably safe.

Figure 2:
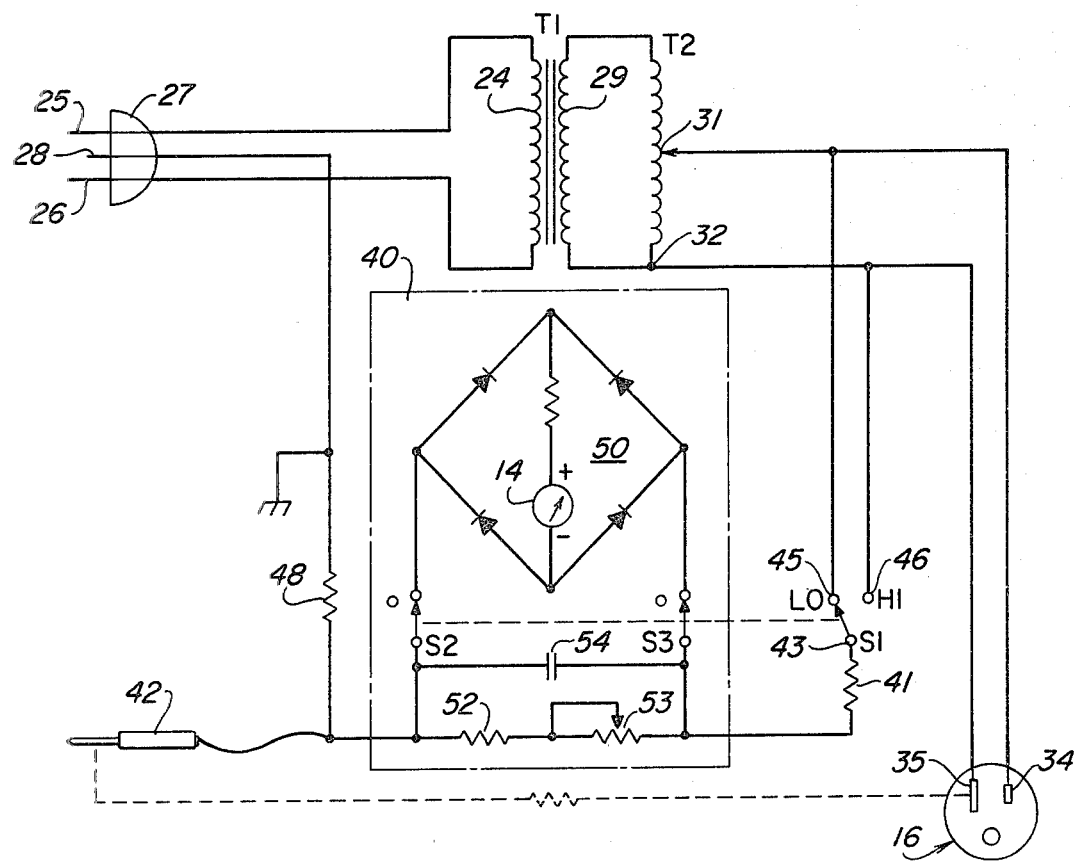

Referring now to FIG. 2 there is shown, in schematic form, the leakage current measuring circuit section of the instrument 10. It will be understood that certain parts of this circuit are common to the current and voltage supply section, but inasmuch as the current and voltage supply circuits are conventional they are not described in detail herein.

As shown, the primary winding 24 of an isolation transformer T1 is connected across the power input terminals 25 and 26 of a power plug 27 which also includes a grounding pin or terminal 28 connected directly to ground. An autotransformer T2 is connected directly across the secondary winding 29 of the isolation transformer T1, and its outputs 31 and 32 are connected to respective terminals 34 and 35 of the output socket 16. The output 31 of the autotransformer T2 is connected to an adjustable tap on the transformer winding whereby the voltage between the terminals 34 and 35 is adjustable.

In accordance with the present invention, an ammeter circuit 40 including the meter 14 is connected in series with a resistor 41 between a probe 42 and the common terminal 43 of a double pole, single throw switch S1. One pole 45 of the switch S1 is connected to the output terminal 35, and the other pole 46 is connected to the terminal 36. The probe 42 is connected to ground through a resistor 48.

The ammeter circuit 40 includes a conventional rectifier bridge 50 which is adapted to be connected across a pair of series connected resistors 52 and 53 and a paralleling smoothing capacitor 54 by a pair of switches S2 and S3 when the switch S1 is in either the high side or low side measuring position. With reference to FIG. 1, when either of the leakage push-buttons is pushed in, the switches S2 and S3 which are mechanically connected to these push buttons connect the bridge 50 across the resistors 52 and 53. Otherwise the switches S2 and S3 disconnect the bridge 50 from the resistors 52 and 53. It will be understood that these switches S2 and S3 may be connected to other measuring circuits such, for example, as current or voltage measuring circuits.

METHOD OF OPERATION

In order to measure the leakage current to ground from exposed parts of an electric appliance or other piece of equipment, the power plug of the unit is plugged into the receptacle 16 and the power switch of the device is placed in the ON position. One of the leakage push-buttons is then pushed in to actuate the switches S2 and S3 to connect the bridge 50 across the resistors 52 and 53. The probe 42 is then touched to the various exposed conductive areas of the device under test while observing the meter 14. Then the other leakage push-button is pushed in and the test is repeated.

The instrument 10 may be calibrated by pushing the VOLTS push-button and using the control 12 to adjust the output voltage to the rated voltage of the equipment under test, that being the voltage at which the leakage current test is to be conducted. If desired, this calibration may be made while the device under test is connected to the socket 16.

While the present invention has been described in connection with a particular embodiment thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed:

1. An instrument for use in measuring leakage currents from a piece of equipment under test to ground, said equipment having first and second electric power input terminals, comprising
    an isolation transformer having an input winding adapted to be connected across a source of electric power,
    first and second output terminals adapted to be connected to respective ones of said electric power input terminals of said equipment,
    means connecting said first and second output terminals across an output winding of said isolation transformer,
    an electric probe,
    an AC ammeter serially connected with said probe, and
    selector switch means for selectively connecting said ammeter to one or the other of said first and second output terminals.

2. An instrument according to claim 1 wherein said means connecting said first and second output terminals across an output winding of said isolation transformer comprises
    means for adjusting the voltage between said first and second output terminals.

3. An instrument according to claim 1 wherein said means connecting said firt and second output terminals across an output winding of said isolation transformer comprises
    an autotransformer.

4. A method of measuring the leakage current from a piece of equipment to ground, said equipment having first and second electric power input terminals, comprising the steps of
    connecting across said first and second input terminals a source of voltage isolated from ground,
    connecting one terminal of an ammeter to one of said input terminals,
    connecting an electric probe to the other terminal of said ammeter, and
    touching said probe to exposed places on said piece of equipment while observing said ammeter,
    then connecting said one terminal of said ammeter to the other of said input terminals, and
    then again touching said probe to said exposed places, whereby the current through said ammeter is proportional to the said leakage current.

5. A method of measuring according to claim 1, comprising
    adjusting the voltage of said source to the rated voltage of said piece of equipment.

* * * * *